(12) United States Patent
Xu et al.

(10) Patent No.: US 10,038,035 B2
(45) Date of Patent: Jul. 31, 2018

(54) ORGANIC LIGHT-EMITTING DISPLAY PANEL AND FORMING METHOD THEREOF

(71) Applicants: Shanghai Tianma AM-OLED Co., Ltd., Shanghai (CN); Tianma Micro-Electronics Co., Ltd., Shenzhen (CN)

(72) Inventors: Zhaozhe Xu, Shanghai (CN); Junxiong Fang, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 57 days.

(21) Appl. No.: 15/166,546

(22) Filed: May 27, 2016

(65) Prior Publication Data

US 2016/0365395 A1  Dec. 15, 2016

(30) Foreign Application Priority Data

Jun. 9, 2015  (CN) .......................... 2015 1 0314150

(51) Int. Cl.
*H01L 27/32* (2006.01)
*H01L 51/52* (2006.01)
*H01L 51/56* (2006.01)

(52) U.S. Cl.
CPC ........ *H01L 27/3244* (2013.01); *H01L 51/525* (2013.01); *H01L 51/5246* (2013.01); *H01L 51/5253* (2013.01); *H01L 51/5256* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 8,664,649 | B2 * | 3/2014 | Lee | ..................... H01L 51/5253 257/100 |
| 2003/0164674 | A1 * | 9/2003 | Imamura | ................ H05B 33/04 313/493 |

(Continued)

FOREIGN PATENT DOCUMENTS

CN  1533682 A  9/2004

*Primary Examiner* — Lex Malsawma
(74) *Attorney, Agent, or Firm* — Kilpatrick Townsend & Stockton LLP

(57) ABSTRACT

The present disclosure provides an organic light-emitting display panel. The organic display panel comprises a substrate, an organic light-emitting structure disposed on the substrate, a package layer covering the organic light-emitting structure. The package layer comprises at least one non-organic block layer and at least one organic block layer, and a block pole. The block pole comprises a first block pole and a second block pole. The second block pole is disposed at the periphery of the first block pole. The at least one non-organic block layer comprises an outmost non-organic block layer. The first block pole is at least covered by the outmost non-organic block layer. The at least one organic block layer can partially cover the first block pole or not cover the first block pole at all. The at least one non-organic block layer can partially cover the second block pole or not cover the second block pole at all.

20 Claims, 7 Drawing Sheets

(56) References Cited

U.S. PATENT DOCUMENTS

| | | | | |
|---|---|---|---|---|
| 2004/0099882 A1* | 5/2004 | Hokari | ................ | H01L 51/0005 257/200 |
| 2013/0161680 A1* | 6/2013 | Oh | ...................... | H01L 51/5253 257/99 |
| 2016/0020369 A1* | 1/2016 | Ukawa | .................. | H01L 33/507 362/311.01 |

* cited by examiner

ORGANIC LIGHT-EMITTING DISPLAY PANEL AND FORMING METHOD THEREOF

CROSS-REFERENCES TO RELATED APPLICATIONS

This application claims priority to a Chinese patent application No. 201510314150.4 filed on Jun. 9, 2015 and entitled "Organic Light-emitting Display Panel and Forming Method Thereof", the disclosure of which is incorporated herein by reference in its entirety.

TECHNICAL FIELD

The present disclosure relates to the field of organic electroluminescence display technologies, in particular to an organic light-emitting display panel and a forming method thereof.

TECHNICAL BACKGROUND

Recently, an organic light-emitting display panel used as a flat panel display, which is a light-emitting device itself, is greatly concerned by more and more people. The organic light-emitting display panel is realized through an Organic Light-Emitting Diode (OLED) disposed on a substrate. The lifetime of the OLED device is not only dependent on selected organic material but it is also dependent on a method for packing the device. As for an organic electronic device, in particular the OLED, it is not desired for oxygen and moisture from the ambient to enter into inside of the device to contact the sensitive organic medium and electrodes. That is because the property of the OLED device is easily degraded or invalidated due to the existence of the oxygen and moisture inside the OLED device, and even a tiny amount of moisture will cause an organic compound layer and an electrode layer to be peeled off, thereby producing a black speck. As a result, in order to restrain the degradation and invalidation of the OLED device during a long term operation process and run stably to reach a sufficient lifetime, block performance of the package material is greatly desired. Nowadays, a method of etching a glass shield or a metallic case is commonly adopted to cover an organic light-emitting portion, and the sealant is applied around the organic light-emitting portion and an absorbent for absorbing the moisture is placed therein so as to guarantee the oxygen and moisture not to close to the organic medium or guarantee the oxygen and moisture to be absorbed by the absorbent before reaching the organic medium, thereby ensuring the lifetime of the organic light-emitting. However, the sealed case has a relative large quality such that the whole dimension of the device is thickened accordingly, which in not in conformity with the light and thin requirements. In addition, the metal is also not suitable for some application due to its opaqueness. Therefore, in order to make the organic light-emitting display panel lighter and thinner, it is necessitated to eliminate the spaces occupied by the absorbent for absorbing the moisture and the glass/metallic case. Based on this, more and more researchers pay their attention to a thin film package. In the thin film package, in order to limit or prevent the invasion of the oxygen and moisture, the package structure is generally configured as a stack of multiple-layer thin films.

The package thin film is often adopted in a manner of a stack of an non-organic film layer and an organic film layer, the dense non-organic film layer blocks water and oxygen, the thicker and soft organic film layer covers the steps on a surface and impurity to relieve pressure. A photomask is needed to pattern the thin film package during a process of forming the film, and the region used for binding IC and cutting is exposed.

The material of the organic film layer has s worse performance of blocking water and oxygen, and cannot be directly exposed in the air. Therefore, it is necessitated to ensure the non-organic firm layer to cover the organic film layer. Currently, the existing corresponding manner is to enlarge the design value of the coverage area covered by the non-organic firm layer, guaranteeing the organic film layer to be entirely covered inside the non-organic firm layer. This method has at least following defects:

1. Although it is guaranteed that the organic film layer is entirely covered inside the non-organic firm layer by enlarging the design value of the coverage area of the non-organic firm layer, the existence of an extended region will lead to an increase in the coverage area of the non-organic firm layer. In addition, the non-organic firm layer itself has a certain extended effect, so that an invalid region located at the periphery of the device is enlarged ultimately, thereby it is not advantageous to a design of narrow frame of the organic electroluminescence.

2. The material of the organic firm layer has a low capability of blocking water and oxygen, even has a capability of absorbing water and oxygen. In terms of the package design of the thin film, it is required that the non-organic firm layer has a coverage area larger than a coverage area of the organic firm layer. However, the precursor of the organic firm layer is generally formed by a liquid material, and the flow of the liquid material is uncontrollable in a certain degree, the extended length of any of positions located at the periphery of the device are not all same as each other, and the fluctuation of the distribution strengths when the thickness of the organic firm layer becomes larger and larger. It is not guaranteed that the organic firm layer is covered efficiently only by relying on the fixed design value of the non-organic firm layer, and the requirement of blocking water and oxygen of the electroluminescence device is unreachable.

FIG. 1 is a cross-sectional view showing an organic light-emitting display panel in the related art. As shown in FIG. 1, U.S. Pat. No. 8,664,649 B2 discloses an empirical formula for an extended length of an organic film layer, where L1 represents the first diameter of the deposition region of an organic film layer 30, L2 represents the second diameter of the non-organic film deposition area, D represents a thickness of the organic film layer in a unit of µm, M represents a dimension of an invalid region caused by the extended portion 31 of the organic film layer:

$$M = 171D + 138.14 \text{ µm}$$

Normally, the height of the impurity occurring at a surface of the OLED device is about in a range of 2 to 4 µm, if it is supposed that the organic film layer has a 5 µm in thickness, M=171*5+138.14 µm=993.14 µm.

Then, an coverage area of the non-organic film layer 40 is needed to be larger than 993 µm, and the length of the invalid area located at the left side and right side of the display region is at least larger than 2 mm(0.993 mm*2), which is not advantageous for the narrow-frame design of the organic light-emitting display panel.

SUMMARY OF THE INVENTION

In view of the above problems, the present disclosure provides an organic light-emitting display panel to realize the narrow-frame design.

An organic light-emitting display panel is provided. The organic light-emitting display panel includes a substrate, an organic light-emitting structure disposed on the substrate, a package layer covering the organic light-emitting structure and a block pole. The package layer comprises at least one non-organic block layer and at least one organic block layer spaced apart from the at least one non-organic block layer. The block pole is disposed at a periphery of the organic light-emitting structure. The block pole can comprise a first block pole and a second block pole. The second block pole can be disposed at the periphery of the first block pole away from the organic light-emitting structure. The at least one non-organic block layer can comprise an outmost non-organic block layer away from the organic light-emitting structure. The first block pole can be at least covered by the outmost non-organic block layer. The at least one organic block layer can partially cover the first block pole or not cover the first block pole at all, and the at least one non-organic block layer can partially cover the second block pole or not cover the second block pole at all.

The present disclosure further provides a method for forming an organic light-emitting display panel. The method includes providing a substrate, forming an organic light-emitting structure on the substrate, disposing a block pole at a periphery of the organic light-emitting structure on the substrate. The block pole can comprise a first block pole and a second block pole, the second block pole is disposed at a periphery of the first block pole away from the organic light-emitting structure. The method can further include disposing a package layer on the substrate for covering the organic light-emitting structure. The disposing can comprise forming an non-organic block layer, and forming an organic block layer. The non-organic block layer can partially cover the second block pole or not cover the second block pole at all. The organic block layer can partially cover the first block layer or not cover the first block layer at all. The non-organic block layer and the organic block layer are spaced apart from each other. An outmost layer of the package layer away from the organic light-emitting structure is an outmost non-organic block layer and the first block pole is at least covered by the outmost non-organic block layer.

With the organic light-emitting display panel and the method for forming an organic light-emitting display panel provided in the present disclosure, since the block pole is disposed at the periphery of the organic light-emitting structure, it can be achieved that the package layer effectively covers the organic light-emitting structure. In addition, if a narrow-frame design is desired for packaging, the block pole can be disposed at a position close to the edge of the organic light-emitting structure as soon as possible, thereby decreasing the frame regions of the organic light-emitting display panel that are not light-emitted to realize the narrow-frame design.

DETAILED DESCRIPTION OF THE PREFERRED EMBODIMENTS

Figure 1:
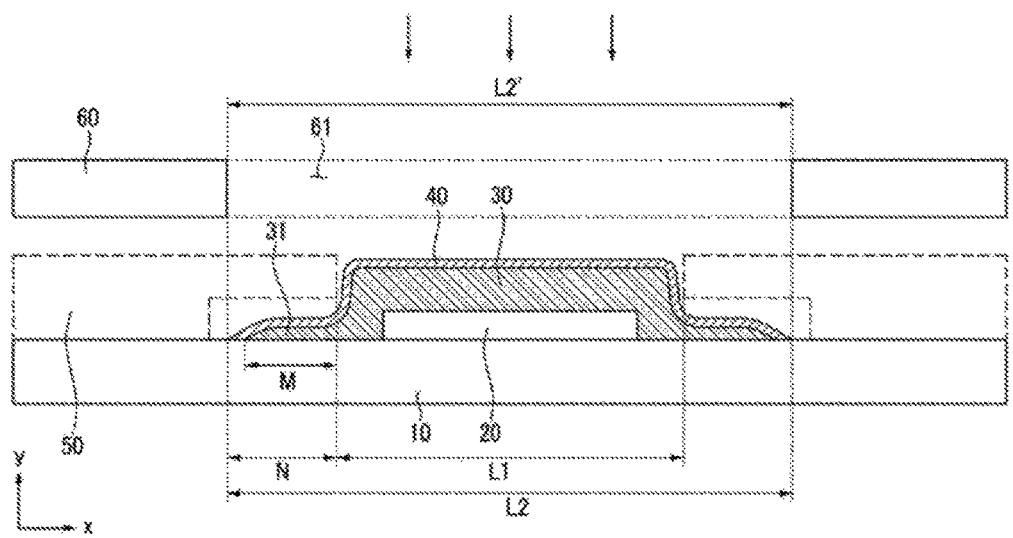
FIG. 1 is a cross-sectional view showing an organic light-emitting display panel in the related art.

In order to better explain the technical contents of the present disclosure, the disclosure will be further described below by example of specific embodiments in combination with the accompanying drawings. The invention is not limited to the specific embodiments and accompanying drawings. For those skilled in the art, changes and modifications can be made to the present disclosure without departing from the spirit and principle of the present disclosure, the scope of the present disclosure should be defined by appended claims.

According to an embodiment of the present disclosure, an organic light-emitting display panel includes a substrate, an organic light-emitting structure disposed on the substrate, a package layer covering the organic light-emitting structure and a block pole disposed at the periphery of the organic light-emitting structure. The package layer can include at least one non-organic block layer and at least one organic block layer spaced apart from the at least one non-organic block layer. The block pole can at least include a first block pole and a second block pole. The second block pole can be disposed at the periphery of the first block pole away from the organic light-emitting structure. The package layer can include an outmost non-organic block layer away from the organic light-emitting structure. The first block pole can be at least covered by the outmost non-organic block layer. The organic block layer can partially cover the first block pole or not cover the first block pole at all, and the non-organic block layer can partially cover the second block pole or not cover the second block pole at all.

When the organic block layer in the package layer is formed on the organic light-emitting structure, the organic material is easily to be extended outside a predetermined coverage region before it is cured since the organic material has a strong fluidity, so that the scope of a non-display region is expanded. As for the non-organic block layer in the package layer, although the non-organic material has an inferior fluidity, when the non-organic block layer is formed by a vapor deposition method and the like, the non-organic material can be easy to diffuse at a gap between the substrate and a mask. A coverage region of the non-organic block layer can then extend the predetermined coverage region, and hence the non-display region is expanded. Thereby it is not advantageous for a narrow-frame design for the organic light-emitting display panel. If the block pole is at first formed at the periphery of the organic light-emitting structure before the package layer is formed, as for the organic block layer, the block pole can be used to block the organic material when the organic block layer is formed. It can be then achieved that the organic material is maintained in the scope of the block pole before it is cured, so that the coverage region of the organic block layer is controllable, thereby avoiding the expansion of the coverage region of the organic block layer. As for the non-organic block layer, the block pole can be used to more compactly engage the substrate with the mask when the non-organic block pole is formed, thereby avoiding the non-organic material to extend outside the predetermined coverage region, so that the coverage region of the non-organic block layer is controllable, thereby avoiding the random expansion of the coverage region of the non-organic block layer.

Since the block pole is disposed at the periphery of the organic light-emitting structure, it can be guaranteed that the package layer effectively covers the organic light-emitting structure. In addition, if the narrow-frame design is desired for packaging, the block pole can be disposed at a position close to the edge of the organic light-emitting structure as soon as possible, thereby decreasing the frame regions of the organic light-emitting display panel that are not light-emitted, realizing the narrow-frame design.

As for the package layer formed by the organic block layer and the non-organic block layer that are spaced apart from each other, the non-organic block layer has a high shield effect. However, since the non-organic block layer has a low elasticity, it may not be desired to disperse the mechanical stress. On one hand, since the non-organic block layer is rigid, a crack can be easily formed in the non-organic block layer or a portion of the non-organic block layer is peeled off when the organic light-emitting display panel is cut later, so that the moisture and oxygen can enter inside the organic light-emitting structure through the crack. When the organic block layer is disposed between the non-organic block layers, the crack can be refrained effectively since the organic block layer has a higher elasticity. Although this layer structure obtains a better effect, the sealing effect is not satisfied. Since it is difficult for the moisture and oxygen to enter the organic light-emitting structure in a thickness direction of the package layer, the moisture and oxygen has an opportunity to instead enter the organic light-emitting structure from the edge of the package layer or a joint site between the package layer and the substrate. Especially, when the edge of the organic block layer is exposed, it is easy for the moisture and oxygen to infiltrate inside the organic light-emitting structure from the edge of the organic block layer, thereby forming a dark speck on the organic light-emitting display panel or causing the organic light-emitting structure to be oxidized or invalidated. With respect to this problem, the package layer includes an outmost non-organic block layer away from the organic light-emitting structure. That is, no matter how many layers exist in the non-organic block layer and the organic block layer that are spaced apart from each other, the outmost layer having a contact with the environment is an non-organic block layer, so as to obtain a best effect of block water and gas in a thickness direction of the package layer. The block pole can be configured to at least include a first block pole and a second block pole. The second block pole can be disposed at the periphery of the first block pole away from the organic light-emitting structure. The organic block layer can partially cover the first block pole or not cover the first block pole at all. That is, the coverage region of the organic block layer can be bounded by the first block pole. The non-organic block layer can partially cover the second block pole or not cover the second block pole at all. That is, the coverage region of the non-organic block layer can be bounded by the second block pole. The first block pole can be at least covered by the outmost non-organic block layer. That is, at least the outmost non-organic block layer can exceed or be about to exceed the region of the first block pole. As a result, at least the outmost non-organic block layer may be arranged such that it is about to cover any of the organic block layers, so that the edge of the organic block layer is not exposed outside, thereby preventing water and gas from infiltrating through the edge of the organic block layer.

Figure 2:
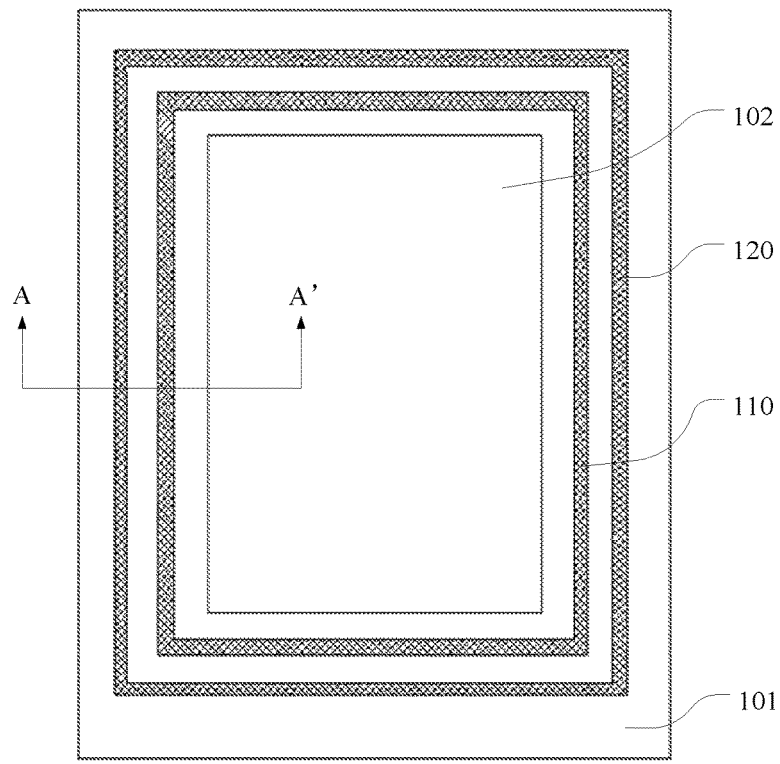
FIG. 2 is a schematic top view of an organic light-emitting display panel according to an embodiment of the present disclosure.
Figure 3:
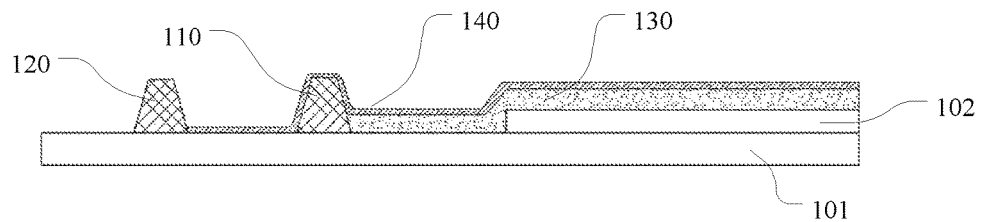
FIG. 3 is a cross-sectional view showing a portion AA' of the organic light-emitting display panel as shown in FIG. 2.

Referring to FIG. 2, FIG. 2 is a schematic top view of an organic light-emitting display panel according to an embodiment of the present disclosure. In this embodiment, an organic light-emitting display panel includes a substrate 101, an organic light-emitting structure 102, a block pole and a package layer (not shown in FIG. 2). The organic light-emitting structure 102 is disposed on the substrate 101, where the organic light-emitting elements and driving circuits and the like relating to display and arranged on the organic light-emitting display panel all are called as an organic light-emitting structure. The block pole is disposed at the periphery of the organic light-emitting structure 102. The block pole of the organic light-emitting display panel 100 as shown in FIG. 2 includes a first block pole 110 and a second block pole 120. The second block pole 120 is disposed at the periphery of the first block pole 110 away from the organic light-emitting structure 102. In order to more clearly illustrate the structure of the package layer, referring to FIG. 3, FIG. 3 is a cross-sectional view showing a portion AA' of the organic light-emitting display panel as shown in FIG. 2. The organic light-emitting display panel shown in FIG. 3 includes a package layer covering the organic light-emitting structure 102. The package layer includes an non-organic block layer 140 and an organic block layer 130 that are spaced apart from each other. With respect to the organic light-emitting structure 102, the non-organic block layer 140 is located at the outside of the organic block layer 130 away from the organic light-emitting structure 102. That is, the non-organic block layer 140 is an outmost non-organic block layer 140. The first block pole 110 is covered by the outmost non-organic block layer 140. The organic block layer 130 does not cover the first block pole 110, and the non-organic block layer 140 does not cover the second block pole 120. Therefore, the organic block layer 130 is defined in the first block pole 110, and the non-organic block layer 140 is defined in the second block pole 120. Since the outmost non-organic block layer entirely covers and exceeds the region of the organic block layer, the outmost non-organic block layer can effectively protect the edge of the organic block layer from being invaded by water and gas.

Figure 4:
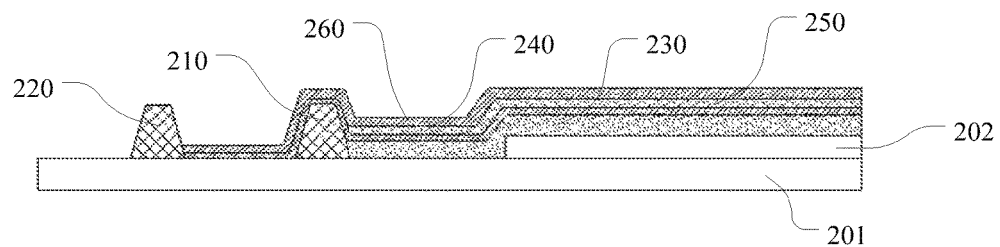
FIG. 4 is a cross-sectional view showing an organic light-emitting display panel according to another embodiment of the present disclosure.

The number of layers of the organic block layer and the non-organic block layer is not intended to be limited. Referring to FIG. 4, FIG. 4 is a cross-sectional view showing an organic light-emitting display panel according to another embodiment of the present disclosure. The organic light-emitting display panel shown in FIG. 4 is similar to the organic light-emitting display panel shown in FIG. 3. The organic light-emitting display panel shown in FIG. 4 includes a substrate 201, an organic light-emitting structure 202, a block pole and a package layer. The block pole includes a first block pole 210 and a second block pole 220. As compared with FIG. 3, the package layer of the organic light-emitting display panel shown in FIG. 4 includes a first organic block layer 230, a first non-organic block layer 240, a second organic block layer 250 and a second non-organic block layer 260. The second non-organic block layer 260 is an outmost non-organic block layer 260 away from the organic light-emitting structure 202. The first block pole 210 is covered by the outmost non-organic block layer 260 and is also covered by the first non-organic block layer 240. The first organic block layer 230 and the second organic block layer 250 do not cover the first block pole 210, and the first non-organic block layer 240 and the second non-organic block layer 260 do not cover the second block pole 220.

The block pole of the organic light-emitting display panel provided in the present disclosure has an annular shape as shown in an embodiment of FIG. 2, which can function as blocking an expansion of the package layer in any direction of the periphery of the organic light-emitting structure. Of course, the shape of the block pole is not intended to be limited. The block pole can be arranged at a side or a plurality of side or any position of the organic light-emitting structure, only if the block pole can function as blocking the expansion of the package layer.

Figure 5:
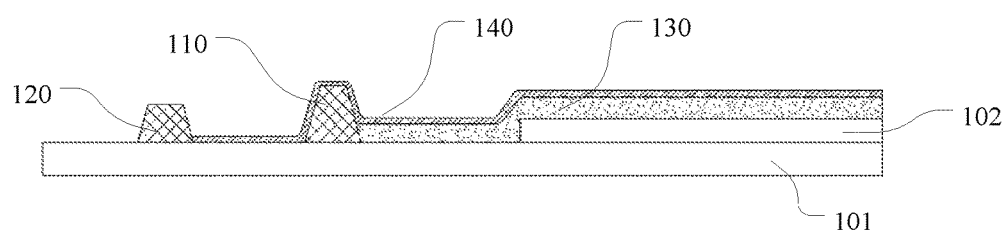
FIG. 5 is a cross-sectional showing an organic light-emitting display panel according to a further embodiment of the present disclosure.

When the package is formed, a mask is arranged on the substrate, and the organic block layer and the non-organic block layer are formed by a chemical deposition or a physical deposition. As for the block pole in the organic light-emitting display panel provided in the present disclosure, the first block pole has a height higher than that of the second block pole. Specifically referring to FIG. 5, FIG. 5 is a cross-sectional view showing an organic light-emitting display panel according to a further embodiment of the present disclosure. As compared with FIG. 3, the organic light-emitting display panel shown in FIG. 5 is similar to that as shown in FIG. 3, the difference is that the height of the first block pole 110 is larger than that of the second block pole 120. Since the coverage region of the organic block layer 130 of the organic light-emitting display panel provided in the present disclosure is defined in the first block pole 110, and the coverage region of the non-organic block layer 140 is defined in the second block pole 120, when the organic block layer 130 is formed, the mask corresponding to the organic block layer 130 will shield an outside region of the first block pole 110 opposite to the organic light-emitting display panel. That is, the mask corresponding to the organic block layer 130 covers the second block pole 120. When the height of the second block pole 120 is smaller than the height of the first block pole 110, it is difficult for the second block pole 120 to jack up the mask. As a result, it can be avoided that the organic material overflows from a gap between the mask and the first block pole 110 caused by the incompact engagement between the mask and the first block pole 110, so that the organic block layer 130 cannot be extended outside the first block pole 110, thereby guaranteeing the organic block layer 130 to be controlled in a certain region. The difference between the height of the first block pole and the height of the second block pole can be in a range of 0 to 4 μm.

The edge of the non-organic block layer is at least larger than the edge of the organic block layer by 200 μm, and hence it is ensured that the non-organic block layer can effectively cover the edge of the organic block layer to achieve the ability of the package layer to block water and oxygen and improve the stability of the package performance for the thin film. In addition, it is not necessary for the edge of the non-organic block layer to be larger than the edge of the organic block layer, and otherwise it will cause the frame of the light-emitting display panel to become larger. Therefore, a distance between the first block pole and the second block pole can be in a range of 200 to 800 μm.

Figure 6:
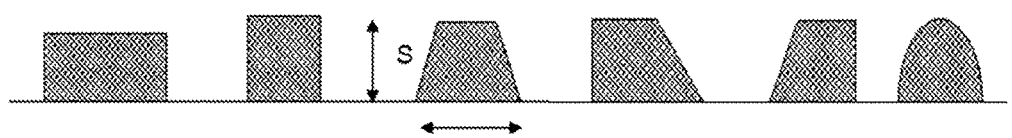
FIG. 6 is a cross-sectional view showing a block pole of an organic light-emitting display panel according to the present disclosure.

FIG. 6 is a cross-sectional view showing a block pole of an organic light-emitting display panel according to the present disclosure. FIG. 6 shows a plurality of section shapes of the block pole, the section of the block pole can have a rectangle shape (including square), or can have a trapezoidal shape, semicircular shape or semielliptical shape. The section shape of the block pole is related to the forming manner of the block pole. As for a manner in which the block pole is formed by an etching process after the film is formed, it is difficult to form a regular rectangle due to the limitation of the process. As a result, it is more suitable for the section shape of the block pole to have a trapezoidal shape, semicircular shape or semielliptical shape. The section of the block pole generally can be of a trapezoidal shape, and can have an angle formed between a waist line of the trapezoidal shape and a base line (the line close to the substrate) of the trapezoidal shape ranges from 20° to 80°. A height (H) of the block pole ranges from 4 to 10 μm. A width (S) of a bottom surface of the block pole close to the substrate ranges from 30 to 100 μm.

The block pole can be made of organic materials, such as photoresist, propenyl polymer, polyimide polymer, polyamide polymer, siloxane polymer and so on. The block pole can be made of non-organic materials, such as silicon oxide ($SiO_x$), silicon nitride ($SiN_x$), Silicon oxynitride ($SiO_xN_y$), Silicon Oxycarbide ($SiO_xC_y$), silicon carbonitride ($SiC_xN_y$) and so on. The above materials can be deposited through a spin process, a printing process, a sputtering process, a Chemical Vapor Deposition (CVD) process, an Atomic Layer Deposition (ALD) process, a Plasma Enhanced Chemical Vapor Deposition (PECVD) process, a High Density Plasma-Chemical Vapor Deposition (HDP-CVD) process or a vacuum deposition and so on.

Figure 7:
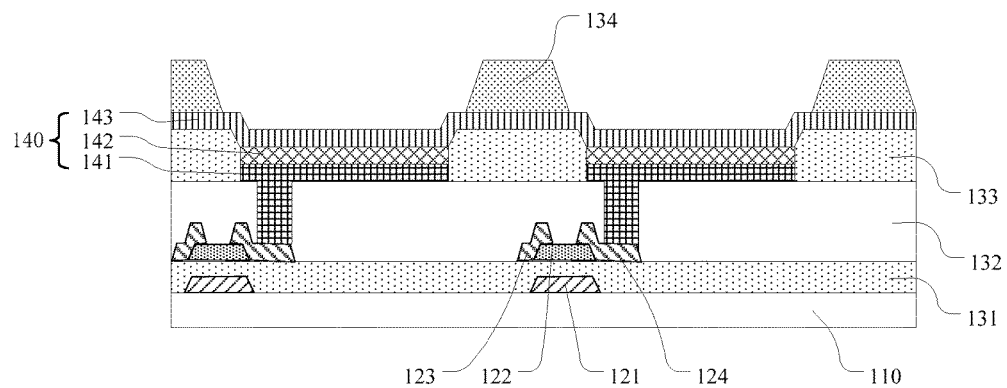
FIG. 7 is a cross-sectional view showing an organic light-emitting structure of an organic light-emitting display panel according to the present disclosure.

The material forming the block pole is not only limited to one kind of material, and the block pole can be formed by stacking film layers of multi-layer material. Further, when the light-emitting structure of the light-emitting display panel is formed, a plurality of film layers are gradually formed on the substrate and individual part is formed by an etching process. Therefore, the block pole can be formed by sufficiently utilizing one layer or more layers of the plurality of film layers. FIG. 7 is a cross-sectional view showing an organic light-emitting structure of an organic light-emitting display panel according to the present disclosure. As shown in FIG. 7, the organic light-emitting structure includes a transistor, an OLED 140 and so on. The transistor includes a gate electrode 121, a semiconductor layer 122, a source electrode 123 and a drain electrode 124. The OLED 140 includes an anode 141, an organic light-emitting layer 142 and a cathode 143. The light-emitting structure further includes an insulation layer 131, a planarization layer 132, a pixel definition layer 133 and a spacing pole layer 134. When any of the film layers is formed in the light-emitting structure, the film layer can be used to manufacture the block pole at the same time. Since the insulation layer 131, the planarization layer 132, the pixel definition layer 133 and the spacing pole layer 134 have a relative large thickness, so it is more effective to use the film layers to manufacture the block pole at the same time. In addition, the block pole is not limited to single layer and can be manufactured by the plurality of film layers in the light-emitting structure. Alternatively, for the block pole with multi-layer structure, some layers of the block pole can be manufactured with the light-emitting structure in the same layer, other layers of the block pole can be formed solely.

Figure 8:
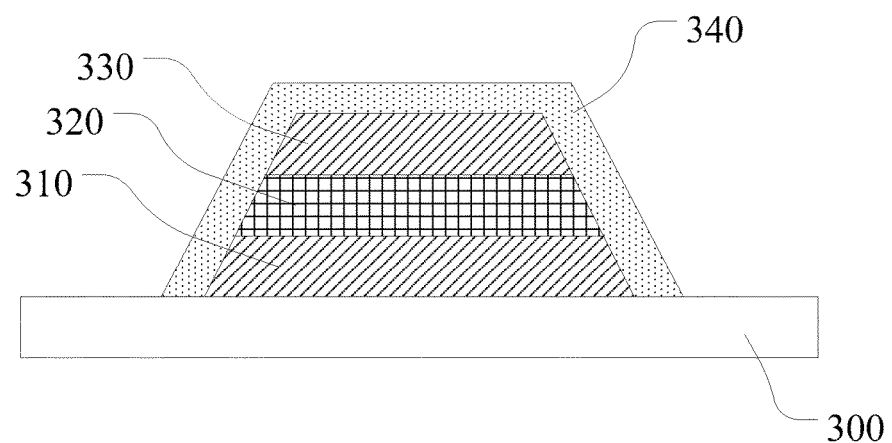
FIG. 8 is a schematic view showing the structure of a block pole according to the present disclosure.

Since the block pole is located at the periphery of the package layer, it is desired for the block pole to have a certain ability to block water and gas, so that the package structure including the package layer and the block pole also obtains a preferable ability to block water and gas in a side direction. Since the non-organic material has a better performance to block water and gas, the block pole can be made of the non-organic material to obtain a better ability to block water and gas. However, on the condition that the block pole is formed by the multi-layer structure, it is not required for each layer included in the block pole to be made of the non-organic material. When the outmost layer of the block pole is made of the non-organic material, the block pole can also obtain a better performance to block water and gas. Specifically, FIG. 8 is a schematic view showing the structure of a block pole according to the present disclosure. As shown in FIG. 8, the block pole is arranged on the substrate 300, and includes a plurality of layers 310, 320, 330 and 340, where the layer 340 is an outmost layer of the block pole and is made of the non-organic material to obtain a better performance to block water and gas.

Figure 9:
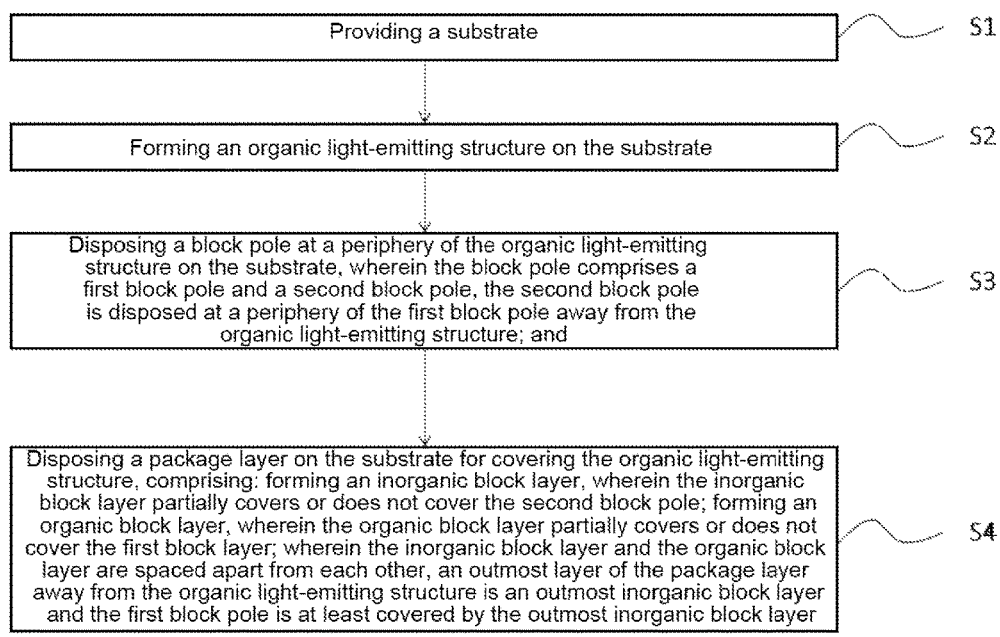
FIG. 9 is a flow chart showing a method for forming an organic light-emitting display panel according to the present disclosure.

The present disclosure also provides a method for forming an organic light-emitting display panel. FIG. 9 is a flow chart showing a method for forming an organic light-emitting display panel according to the present disclosure. As shown in FIG. 9, the method includes:

At S1, a substrate is provided.

At S2, an organic light-emitting structure is formed on the substrate.

At S3, a block pole is disposed at the periphery of the organic light-emitting structure on the substrate. The block pole includes at least a first block pole and a second block pole. The second block pole is disposed at the periphery of the first block pole away from the organic light-emitting structure.

At S4, a package layer is disposed on the substrate for covering the organic light-emitting structure. The disposing includes: forming an non-organic block layer, wherein the non-organic block layer partially covers or does not cover the second block pole, and forming an organic block layer, wherein the organic block layer partially covers or does not cover the first block layer; wherein the non-organic block layer and the organic block layer are spaced apart from each other, an outmost layer of the package layer away from the organic light-emitting structure is an non-organic block layer and the first block pole is at least covered by the outmost non-organic block layer.

The method for forming an organic light-emitting display panel is used to form the organic light-emitting display panel provided in the present disclosure. As a result, the related information in the embodiments of the organic light-emitting display panel provided in the present disclosure is also used to provide a reference to the method. Specifically, referring to FIGS. 10A to 10F, FIGS. 10A to 10F are flow charts showing a process of a method for forming an organic light-emitting display panel according to the present disclosure.

Figure 10A:
FIGS. 10A to 10F are flow charts showing a process of a method for forming an organic light-emitting display panel according to the present disclosure.

Regarding step S1, as shown in FIG. 10A, a substrate 501 is provided, and the substrate 501 can be a glass substrate or a plastics substrate, for example a polyimide plastics substrate.

Figure 10B:
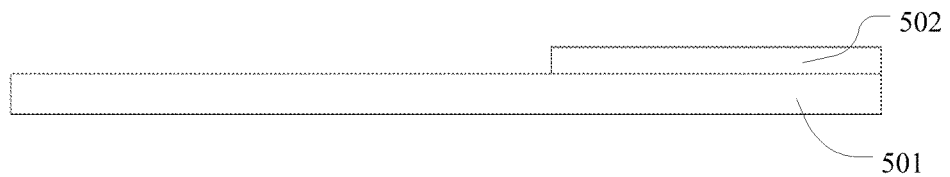

Regarding step S2, as shown in FIG. 10B, an organic light-emitting structure 102 is formed on the substrate 501. Since the organic light-emitting structure is not a key role in the present disclosure, the structure and the manufacturing process of the organic light-emitting structure are not further described in detail. Of course, the light-emitting structure herein includes the parts related to organic light-emitted display, such as an OLED.

Figure 10C:
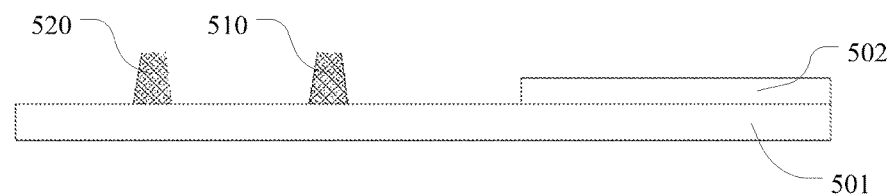

Regarding step S3, as shown in FIG. 10C, a block pole is disposed at the periphery of the organic light-emitting structure 502 on the substrate 501, the block pole includes at least a first block pole 510 and a second block pole 520. The second block pole 520 is disposed at the periphery of the first block pole 510 away from the organic light-emitting structure 502. For the block pole being disposed at periphery of the organic light-emitting structure, the embodiments shown in FIG. 2 can be referred. FIG. 2 shows the organic light-emitting structure 102, the first block pole 110 surrounds the periphery of the organic light-emitting structure, while the second block pole 120 surrounds the periphery of the first block pole 110. The block pole shown in FIG. 2 has a continuous annular shape, of course, the block pole can be not continuous and can be disposed at one side or a plurality of sides of the periphery of organic light-emitting structure. As for the material forming the block pole, it has been described in embodiments of the organic light-emitting display panel provided in the present disclosure, the specific process forming the block pole can be referred to a film-forming process, an exposure process and an etching process commonly used in the field of the display panel.

Figure 10D:
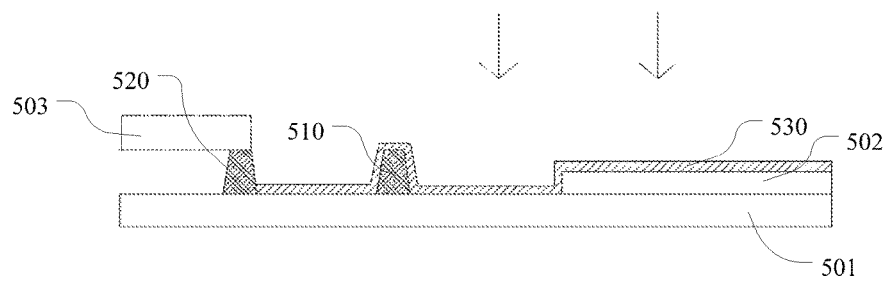
Figure 10E:
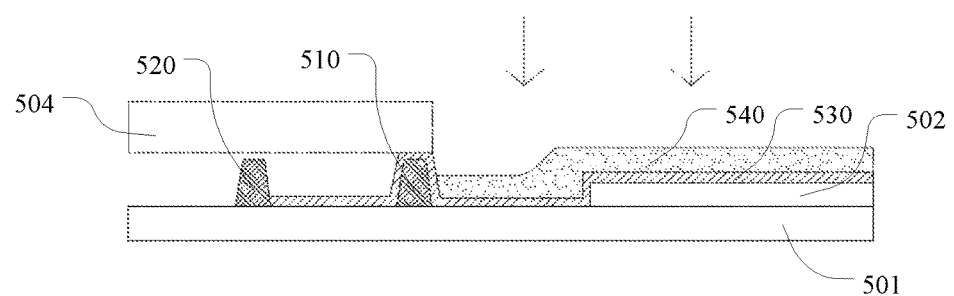
Figure 10F:
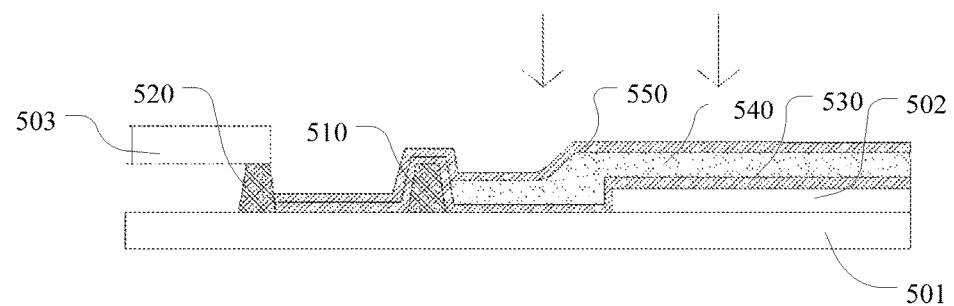

Regarding step S4, FIGS. 10D to 10F show an implementation of step S4. First, referring to FIG. 10D, a first mask 503 is disposed above the substrate 501, the first mask 503 covers a region of the second block pole 520 away from the periphery of the organic light-emitting structure 502, a region on the first mask 503 corresponding to the inside of the second block pole 520 facing the organic light-emitting structure 502 is a hollow-out region, and the first non-organic block layer 530 is deposited through the first mask 503. As a protrusion, the second block pole 520 can realize a better engagement between the organic light-emitting display panel and the first mask 503. In the process of depositing the first non-organic block layer 530, it is difficult for the non-organic material to diffuse outside the second block pole through a gap between the first mask 503 and the organic light-emitting display panel, so that the first non-organic block layer 530 can partially covers the second block pole 520 or not cover the second block pole 520 at all. Then, referring to FIG. 10E, a second mask 504 is disposed above the substrate 501, the second mask 504 covers a region of the first block pole 510 away from the periphery of the organic light-emitting structure 502, and a region on the second mask 504 corresponding to the inside of the first block pole 510 facing the organic light-emitting structure 502 is a hollow-out region, the first organic block layer 540 is deposited through the second mask 504, in the process of depositing the first organic block layer 540, the organic material has a certain fluidity and then is easy to extend to a region covered by the second mask 504 before it is cured. That is, it is easy for the organic material to extend outside the predetermined region, thereby enlarging the invalid region outside the organic light-emitting structure. Since the first block pole 510 arranged in the present disclosure can block the flow of the organic material, the organic material will be defined in the first block pole 510. Therefore, the obtained first organic block layer 540 can partially cover the first block pole 510 or not cover the first block pole 510 at all. Next, referring to FIG. 10F, the first mask 503 is disposed above the substrate 501 again, the first mask 503 covers a region of the second block pole 520 away from the periphery of the organic light-emitting structure 502, and a region on the first mask 503 corresponding to the inside of the second block pole 520 facing the organic light-emitting structure 502 is a hollow-out region, the second non-organic block layer 550 is deposited through the first mask 503.

Identically, the second non-organic block layer 550 can partially cover the second block pole 520 or not cover the second block pole 520 at all. To this end, the arrangement of the package layer of the organic light-emitting display panel provided in the implementation method is finished. In this implementation method, the arrangement of the package layer includes sequentially arranging a first non-organic block layer 530, a first organic block layer 540 and a second non-organic block layer 550, where the first non-organic block layer 530 and the second non-organic block layer 550 partially cover the second block pole 520 or do not cover the second block pole 520, the first organic block layer 540 partially covers the first block pole 510 or does not cover the first block pole 510. The first organic block layer 540 is located between the first non-organic block layer 530 and the second non-organic block layer 550, an outmost layer of the package layer away from the organic light-emitting structure 502 is the second non-organic block layer 550, the first block pole 510 is covered by the outmost non-organic block layer 550, and the first block pole 510 is also covered by the first non-organic block layer 530.

In other implementations, an organic block layer can be formed first, and then an non-organic block layer is formed. The amount of layers of the organic block layer and the non-organic block layer are not limited, only if the organic block layer and the non-organic block layer are spaced apart from each other it is possible that only the outmost non-organic block layer covers the first block pole, or a part of non-organic block layers including the outmost non-organic block layer cover the first block pole, or it is possible that all of the non-organic block layers cover the first block pole to guarantee the edges of all the organic block layers to be covered by the non-organic block layers.

In some implementations, the height of the first block pole is larger than that of the second block pole, and the difference between the height of the first block pole and the height of the second block pole ranges from 0 to 4 µm. The advantage that the height of the first block pole is larger than that of the second block pole has been described in the embodiments of the organic light-emitting display panel, which is not repeatedly described in detail herein. In addition, in order to save material and process, the block pole can be manufactured with the insulation layer, the planarization layer, the pixel definition layer and the spacing pole layer in the same layer. The block pole can be manufactured to be in a single layer or can be formed by stacking a plurality of layers. For a case in which the block pole has a single layer structure or has a multi-layer structure, the height of the second block pole can be reduced to a height lower than the height of the first block pole by using an etching process; for a case in which the block pole has a multi-layer structure, the amount of layers of the second block pole can be reduced to an amount of layers less than the amount of layers of the first block pole to realize that the height of the first block pole is higher than the height of the second block pole.

The edge of the non-organic block layer is at least larger than the edge of the organic block layer by 200 µm, and hence it is ensured that the non-organic block layer can effectively cover the edge of the organic block layer to guarantee the ability of the package layer to block water and oxygen and improve the stability of the package performance for the thin film. In addition, the edge of the non-organic block layer is not necessitated to be larger than the edge of the organic block layer, and otherwise it will cause the frame of the light-emitting display panel to become larger. Therefore, a distance between the first block pole and the second block pole can be in a range of 200 to 800 µm.

The section of the block pole is not limited. The section of the block pole can have a rectangle shape (including square), or can have a trapezoidal shape, semicircular shape or semielliptical shape. The section shape of the block pole is related to the forming manner of the block pole. As for a manner in which the block pole is formed by an etching process after the film is formed, it is difficult to form a regular rectangle due to the limitation of the process, as a result, it is more suitable for the section shape of the block pole to have a trapezoidal shape, semicircular shape or semielliptical shape. The section of the block pole generally has a trapezoidal shape, and an angle formed between a waist line of the trapezoidal shape and a base line (the line close to the substrate) of the trapezoidal shape ranges from 20° to 80°. A height of the block pole ranges from 4 to 10 µm. A width of a bottom surface of the block pole close to the substrate ranges from 30 to 100 µm.

Since the non-organic material has a better performance to block water and gas, the block pole can be made of the non-organic material to obtain a better ability to block water and gas. However, on the condition that the block pole is formed by the multi-layer structure, it is not required for each layer included in the block pole to be made of the non-organic material. In a case that the outmost layer of the block pole is made of the non-organic material, the block pole can also obtain a better performance to block water and gas.

It is noted that the above embodiments are only preferable embodiments and applied technical principle of the present disclosure. Those skilled in the art should understand that the present disclosure is not limited to the above specified embodiments, various modifications and variations can be made to the present disclosure by those skilled in the art without departing from the spirit and scope of the present disclosure. Thus, although the present disclosure is described in detail through the above embodiments, the present disclosure is not limited to the above described embodiments, other identical embodiments can be included in the present disclosure without departing from the spirit of the present disclosure, and the scope of the present disclosure is defined by appending claims.

The invention claimed is:

1. An organic light-emitting display panel, comprising:
a substrate;
an organic light-emitting structure disposed on the substrate;
a package layer covering the organic light-emitting structure, wherein the package layer comprises at least one non-organic block layer and at least one organic block layer spaced apart from the at least one non-organic block layer; and
a block pole disposed at a periphery of the organic light-emitting structure, wherein the block pole comprises a first block pole and a second block pole, the second block pole being only disposed at the periphery of the first block pole away from the organic light-emitting structure, wherein the at least one non-organic block layer comprises an outmost non-organic block layer away from the organic light-emitting structure, the first block pole being at least covered by the outmost non-organic block layer, and wherein the second block pole protrudes above the outmost non-organic block layer.

2. The organic light-emitting display panel of claim 1, wherein the first block pole has a height higher than that of the second block pole.

3. The organic light-emitting display panel of claim 2, wherein a difference between the height of the first block pole and the height of the second block pole ranges from 0 to 4 µm.

4. The organic light-emitting display panel of claim 1, wherein a distance between the first block pole and the second block pole ranges from 200 µm to 800 µm.

5. The organic light-emitting display panel of claim 1, wherein a section of the block pole has a trapezoidal shape, a semicircular shape or a semielliptical shape.

6. The organic light-emitting display panel of claim 1, wherein
a section of the block pole has a trapezoidal shape, and
an angle is formed between a waist line of the trapezoidal shape and a base line of the trapezoidal shape and the angle ranges from 20° to 80°.

7. The organic light-emitting display panel of claim 1, wherein a height of the block pole ranges from 4 µm to 10 µm.

8. The organic light-emitting display panel of claim 1, wherein a width of a bottom surface of the block pole closest to the substrate ranges from 30 µm to 100 µm.

9. The organic light-emitting display panel of claim 1, wherein the organic light-emitting structure comprises one or more of an insulation layer, a planarization layer, a pixel definition layer and a spacing pole layer, and the block pole and the organic light-emitting structure are made in a same layer.

10. The organic light-emitting display panel of claim 1, wherein an outmost layer of the block pole is made of non-organic materials.

11. A method for forming an organic light-emitting display panel, comprising:
providing a substrate;
forming an organic light-emitting structure on the substrate;
disposing a block pole at a periphery of the organic light-emitting structure on the substrate, wherein the block pole comprises a first block pole and a second block pole, the second block pole being only disposed at a periphery of the first block pole away from the organic light-emitting structure; and
disposing a package layer on the substrate for covering the organic light-emitting structure, comprising:
forming an organic block layer; and
forming an non-organic block layer, wherein the second block pole protrudes above the outmost non-organic block layer; and, wherein
the non-organic block layer and the organic block layer are spaced apart from each other, an outmost layer of the package layer away from the organic light-emitting structure is an outmost non-organic block layer and the first block pole is at least covered by the outmost non-organic block layer.

12. The method for forming an organic light-emitting display panel of claim 11, wherein the first block pole has a height higher than that of the second block pole.

13. The method for forming an organic light-emitting display panel of claim 12, wherein
a difference between the height of the first block pole and the height of the second block pole ranges from 0 to 4 µm.

14. The method for forming an organic light-emitting display panel of claim 11, wherein
a distance between the first block pole and the second block pole ranges from 200 µm to 800 µm.

15. The method for forming an organic light-emitting display panel of claim 11, wherein
the section of the block pole has a trapezoidal shape, a semicircular shape or a semielliptical shape.

16. The method for forming an organic light-emitting display panel of claim 11, wherein
a section of the block pole has a trapezoidal shape, and
an angle is formed between a waist line of the trapezoidal shape and a base line of the trapezoidal shape and the angle ranges from 20° to 80°.

17. The method for forming an organic light-emitting display panel of claim 11, wherein
the block pole has a height ranging from 4 µm to 10 µm.

18. The method for forming an organic light-emitting display panel of claim 11, wherein
the organic light-emitting structure comprises one or more of an insulation layer, a planarization layer, a pixel definition layer and a spacing pole layer, and the block pole and the organic light-emitting structure are made in a same layer.

19. The method for forming an organic light-emitting display panel of claim 11, wherein
an outmost layer of the block pole is made of non-organic materials.

20. An organic light-emitting display panel, comprising:
a substrate;
an organic light-emitting structure disposed on the substrate;
a package layer covering the organic light-emitting structure, wherein the package layer comprises at least one non-organic block layer and at least one organic block layer spaced apart from the at least one non-organic block layer; and
a block pole disposed at a periphery of the organic light-emitting structure, wherein the block pole comprises a first block pole and a second block pole, the second block pole being disposed at the periphery of the first block pole away from the organic light-emitting structure, wherein the at least one non-organic block layer comprises an outmost non-organic block layer away from the organic light-emitting structure, the first block pole being at least covered by the outmost non-organic block layer, wherein the second block pole only partially overlaps or does not overlap with the outmost non-organic block layer.

* * * * *